United States Patent
Zhu et al.

(10) Patent No.: US 9,973,183 B2
(45) Date of Patent: May 15, 2018

(54) FIELD-EFFECT TRANSISTOR DEVICE WITH PARTIAL FINGER CURRENT SENSING FETS

(71) Applicant: Power Integrations, Inc., San Jose, CA (US)

(72) Inventors: Lin Zhu, Saratoga, CA (US); Kamal Raj Varadarajan, Santa Clara, CA (US); Yury Gaknoki, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 430 days.

(21) Appl. No.: 14/867,432

(22) Filed: Sep. 28, 2015

(65) Prior Publication Data

US 2017/0093387 A1  Mar. 30, 2017

(51) Int. Cl.
*H02H 9/02* (2006.01)
*H03K 5/24* (2006.01)
(Continued)

(52) U.S. Cl.
CPC ....... *H03K 5/2472* (2013.01); *G01R 19/0092* (2013.01); *G01R 19/16519* (2013.01); *H01L 27/088* (2013.01); *H02H 3/20* (2013.01)

(58) Field of Classification Search
USPC ....................................................... 361/93.7
See application file for complete search history.

(56) References Cited

U.S. PATENT DOCUMENTS

| 4,553,084 A | 11/1985 | Wrathall |
| 4,951,102 A | 8/1990 | Beitman |

(Continued)

FOREIGN PATENT DOCUMENTS

| JP | S062114459 | 5/1987 |
| JP | H06334189 | 12/1994 |

(Continued)

OTHER PUBLICATIONS

Niu et al. "Sensing Power MOSFET Junction Temperature Using Gate Drive Turn-On Current Transient Properties" IEEE Energy Conversion Congress and Exposition (ECCE), IEEE Sep. 14, 2014 pp. 2909-2916.

*Primary Examiner* — Ronald W Leja
(74) *Attorney, Agent, or Firm* — The Law Offices of Bradley J. Bereznak

(57) ABSTRACT

A lateral semiconductor field-effect transistor (FET) device fabricated on a substrate includes a high-voltage main FET having interdigitated, elongated source and drain electrode fingers each of which is electrically connected to a respective interdigitated, elongated source and drain region disposed in the substrate. The FET device further includes first and second sense FETs each having a drain region in common with the high-voltage main FET. The sense FETS also include respective first and second elongated source electrode fingers each of which is electrically connected to respective first and second elongated source regions of the first and second sense FETs, respectively. The first and second elongated source electrode fingers are disposed length-wise adjacent to one of the elongated drain electrode fingers. The first elongated source finger has a first length, and the second elongated source finger has a second length, the second length being less than the first length.

19 Claims, 4 Drawing Sheets

(51) Int. Cl.
*H01L 27/088* (2006.01)
*H02H 3/20* (2006.01)
*G01R 19/00* (2006.01)
*G01R 19/165* (2006.01)

(56) References Cited

U.S. PATENT DOCUMENTS

| | | | |
|---|---|---|---|
| 5,821,580 | A | 10/1998 | Kuwahara |
| 6,323,703 | B1 | 11/2001 | Fotouhi |
| 6,573,558 | B2 | 6/2003 | Disney |
| 6,583,663 | B1* | 6/2003 | Disney .............. H01L 23/4824 327/565 |
| 7,554,152 | B1 | 6/2009 | Ranucci et al. |
| 8,022,456 | B2 | 9/2011 | Parthasarathy |
| 8,134,188 | B2* | 3/2012 | Richardson ........ H01L 27/0207 257/202 |
| 9,152,163 | B1 | 10/2015 | Tabbro et al. |
| 9,195,252 | B1 | 11/2015 | Tanase |
| 9,293,535 | B2 | 3/2016 | Wang et al. |
| 2002/0093366 | A1 | 7/2002 | Fotouhi |
| 2004/0227545 | A1 | 11/2004 | Nadd et al. |
| 2005/0167742 | A1 | 8/2005 | Challa et al. |
| 2005/0167749 | A1 | 8/2005 | Disney |
| 2005/0218963 | A1 | 10/2005 | Ball |
| 2007/0131938 | A1* | 6/2007 | Williams ............ H01L 27/0605 257/77 |
| 2008/0157209 | A1* | 7/2008 | Sutardja ............ H01L 23/5386 257/368 |
| 2008/0197396 | A1 | 8/2008 | Parthasarathy |
| 2008/0197397 | A1 | 8/2008 | Parthasarathy et al. |
| 2008/0197406 | A1 | 8/2008 | Parthasarathy et al. |
| 2009/0039869 | A1* | 2/2009 | Williams .......... H01L 23/49575 324/123 R |
| 2011/0248702 | A1 | 10/2011 | Kume |
| 2013/0332750 | A1 | 12/2013 | Souma |
| 2014/0070313 | A1 | 3/2014 | Wang et al. |
| 2015/0309524 | A1 | 10/2015 | Levhar et al. |
| 2016/0013765 | A1* | 1/2016 | Peluso .................. H03F 3/005 330/260 |
| 2016/0056138 | A1 | 2/2016 | Shibib |
| 2016/0086937 | A1* | 3/2016 | Vorhaus ............ H01L 27/0605 257/296 |
| 2016/0191021 | A1 | 6/2016 | Zhao et al. |
| 2016/0240471 | A1* | 8/2016 | Klowak ............ H01L 23/4824 |
| 2017/0093387 | A1* | 3/2017 | Zhu .................... H03K 5/2472 |
| 2018/0019261 | A1* | 1/2018 | Whitefield ........ H01L 27/0207 |

FOREIGN PATENT DOCUMENTS

| | | |
|---|---|---|
| JP | H08139200 | 5/1996 |
| JP | H09213926 | 8/1997 |
| JP | H10256541 | 9/1998 |
| JP | H11202002 | 7/1999 |
| JP | 2009081381 | 4/2009 |
| WO | 2016055796 | 4/2016 |

* cited by examiner

FIELD-EFFECT TRANSISTOR DEVICE WITH PARTIAL FINGER CURRENT SENSING FETS

TECHNICAL FIELD

This application relates generally to current sense transistors and, more specifically, to a field-effect transistor (FET) structure and circuitry providing multiple sense functionality.

BACKGROUND

Current sensing field-effect transistors, which are frequently referred to as sense FETs., have been used for many years in integrated circuit applications where accurate current sensing can provide information for both control and over-current protection. Sense FETs are typically constructed as a small part or transistor section of a larger, main current carrying semiconductor device. For example, in a conventional insulated-gate field-effect transistor (MOSFET) device, the sense FET may comprise a small section of the channel region of the main device. In operation, the sense FET may sample a small fraction of the channel current of the larger device, thereby providing an indication of the current flowing through the main transistor device. The sense FET and main device typically share a common drain and gate, but each has a separate source electrode which may or may not be shorted to the body region.

Sense FETs are particularly useful in many power delivery applications to provide current limit protection and accurate power delivery. However, the accuracy of such type current sensing is relatively poor due to the possible changes in drain to source resistance ($R_{DS}$) of the power FET. In silicon (Si) MOSFETs the $R_{DS}$ mostly changes as a function of the junction temperature. Current sensing ratio (CSR) variations may be compensated by thermal coupling of a sense resistor to the MOSFET and appropriate matching of the temperature coefficient (TC) of the sense resistor with the TC of the MOSFET. It is appreciated that in gallium nitride (GaN) FET devices the $R_{DS}$ may change not only as a function of temperature but also as a function of applied drain-source voltage $V_{DS}$ (during OFF time). These extra variables make it more difficult to identify and compensate for all the stresses that cause inaccuracies in current sensing.

For accurate current sensing functions the sense transistor generally should maintain a constant CSR with respect to a main power transistor over a wide range of parameters. The drain current may change from a minimum load to the maximum allowable load and to the over current fault protection limit (e.g., 100 mA to 10 amperes). A wide range of temperature change (e.g., −25° C. to 125° C.), as well as fabrication process variations and mechanical stress/packaging variations may cause discrepancies. The ratio of drain current of the main power transistor to that of the sense transistor typically ranges between 20:1 to 800:1, or greater, which makes it very difficult to keep an accurate current ratio with a single current sense transistor for all conditions of low load current measurement up to very high current limit for protection (e.g., in short circuit fault).

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
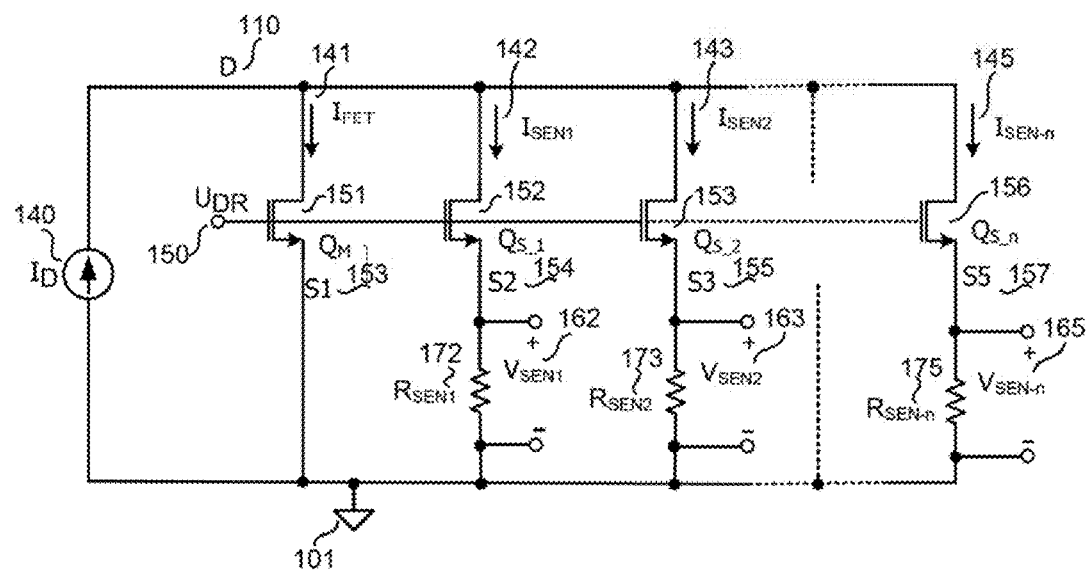
FIG. 1 is an example circuit model of a power MOSFET having multiple sense FETs and sense resistors.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description specific details are set forth, such as device types, voltages, component values, circuit configurations, etc., in order to provide a thorough understanding of the embodiments described. However, persons having ordinary skill in the relevant arts will appreciate that these specific details may not be needed to practice the embodiments described. It is further appreciated that well known circuit structures and elements have not been described in detail, or have been shown in block diagram form, in order to avoid obscuring the embodiments described.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off state" or "off" the transistor does not substantially conduct current. Conversely, when a transistor is in an "on state" or "on" the transistor is able to substantially conduct current. By way of example, in one embodiment, a high-voltage transistor comprises an N-channel metal-oxide-semiconductor field-effect transistor (NMOS) with the high-voltage being supported between the first terminal, a drain. and the second terminal, a source. The high voltage MOSFET comprises a power switch that is driven by an integrated controller circuit to regulate energy provided to a load. For purposes of this disclosure, "ground" or "ground potential" refers to a reference voltage or potential against which all other voltages or potentials of an electronic circuit or Integrated circuit (IC) are defined or measured, A partial finger sense device is disclosed that, in one embodiment, may be applied to lateral transistors with different types of materials such as Si, SiC or HEMT (high electron mobility transistors) devices utilizing the wide-band-gap compound semiconductor known as gallium nitride (GaN). In one embodiment, the sense device implements multiple sensing functions in one high-voltage MOSFET. In one implementation, the sensing device includes first and second sensing MOSFETs that may be used to provide both current limiting and current sensing functions.

FIG. 1 shows an example circuit model of a power MOSFET with multiple sense FETs and sense resistors that each may serve a different purpose/functionality. Current source $I_D$ 140 provides the drain current to the common drain node 110. Drain current is divided to the main transistor current $I_{FET}$ 141 and multiple sense transistor currents $I_{SEN1}$ 142, $I_{SEN2}$ 143 and any further existing sense transistor current, up to, for example, $I_{SEN\_n}$ 145. It is appreciated that two or more sense FETs can be created by partially dividing a single section of source/drain finger regions of a power transistor into multiple sections. Control terminals of the main FET $Q_M$ 151 and the sense FETs $Q_{s\_1}$ 152, $Q_{s\_2}$ 153, and up to the sense FET $Q_{S\_n}$ 156, all are coupled together and receive a common control (drive) signal $U_{DR}$ 150 applied to a gate common to the high-voltage main FET and the sensing FETs to turn all of them ON/OFF simultaneously.

Due to the separate source region S1 153 of the high-voltage main transistor $Q_M$ 131 and the sense transistors' source regions, S2 154, S3 155, and S5 157, each sense transistor may have an individual sense resistor in series; that is, $R_{SEN1}$ 172 in series with $Q_{S\_n}$ 152, $R_{sEN2}$ 173 in series with $Q_{S\_2}$ 153, and $R_{SEN-n}$ 172 in series with $Q_{S\_n}$ 156. When the high-voltage main transistor $Q_M$ 151 and the sense FETs $Q_{S\_1}$ 152. $Q_{S\_2}$ 153 and $Q_{S\_n}$ 156 are in the ON state, the sense current through each of these resistors generates voltage drops $V_{SEN1}$ 162, $V_{SEN2}$ 163 and $V_{SEN-n}$ 165 respectively. It is appreciated that the combination of each sense FET and its series sense resistor together defines the sense current through each partial sense finger and the sense current ratio for that partial sense finger. The measured voltage drop is utilized in combination with the size of each sense transistor to define a known current ratio for each partial sense transistor, and to accurately reflect the main power FET current, with multiple scales of current during different events for different control purposes.

Figure 2:
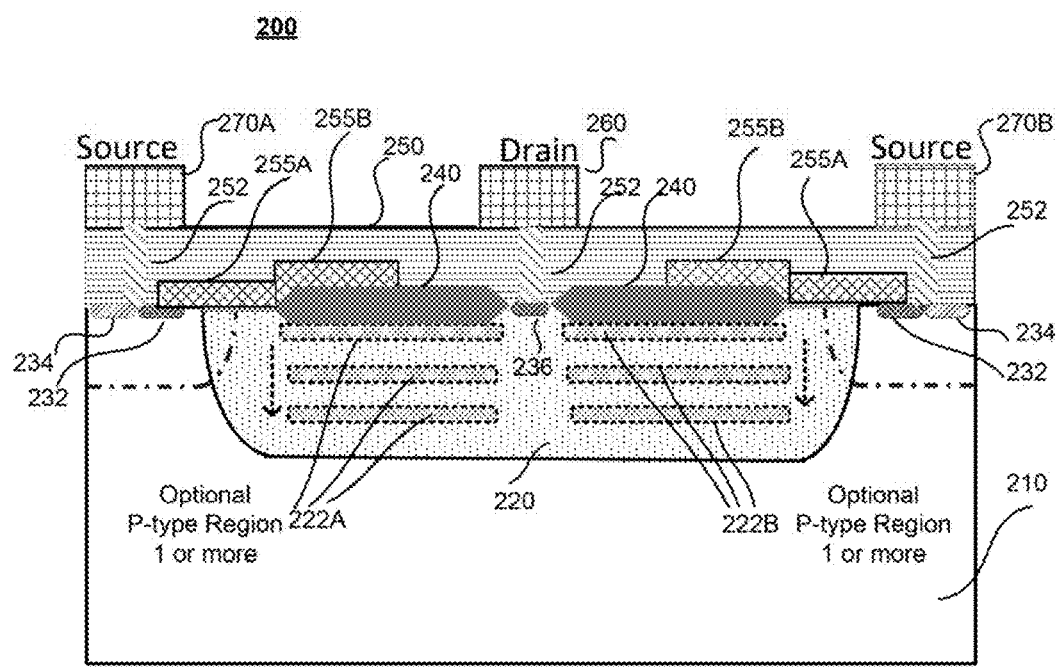
FIG. 2 is a schematic representation of a cross-sectional view of an example lateral-channel MOSFET device.

FIG. 2 is a schematic representing the cross-sectional view of an example lateral-channel transistor 200. Transistor 200 includes a first P-type substrate layer 210, and a well region 220 that in an N-channel device is commonly called an N-well, N-well 220 forms a conducting drift region between the drain and source electrodes. Transistor 200 also includes a drain electrode 260, source electrodes 270A/270B, as well as gate electrodes 255A, with gate field plates 255B extending laterally over thick oxide layers 240. Each oxide layer 240 separates or electrically isolates the gate electrode and gate field plate from the underlying conduction channels formed in N-well 220. The oxide layer 240 may be deposited thicker under the gate field plates 255B as compared to the relatively thin gate oxide layer formed beneath gate electrodes 255A.

As shown in FIG, 2, a passivation layer 250 covers the substrate surface. Drain and source electrodes are respectively coupled to the underlying drain and source semiconductor regions via tungsten plugs 252. The Ni+ drain region 236 and N+ source regions 232 are formed under the respective drain and source electrodes 260 & 270A/B. The extended source region (dash-dot border lines) may have special ion implants for threshold voltage adjustment. Pi+ regions 234 disposed adjacent to N+ regions 232 are also shown included in the extended source regions. Source regions 232 are shown laterally separated from N well 220 by a portion of substrate 210.

The selective biasing of gate electrodes 255A regulates the lateral conductivity through N-well 220 between drain region 236 and source regions 232. It is appreciated that the optional P-type buried regions 222A & 222B may be formed inside N-well 220 to define a plurality of lateral conduction channels, which may improve conductivity and help lower the conduction resistance between drain and source.

Figure 3:
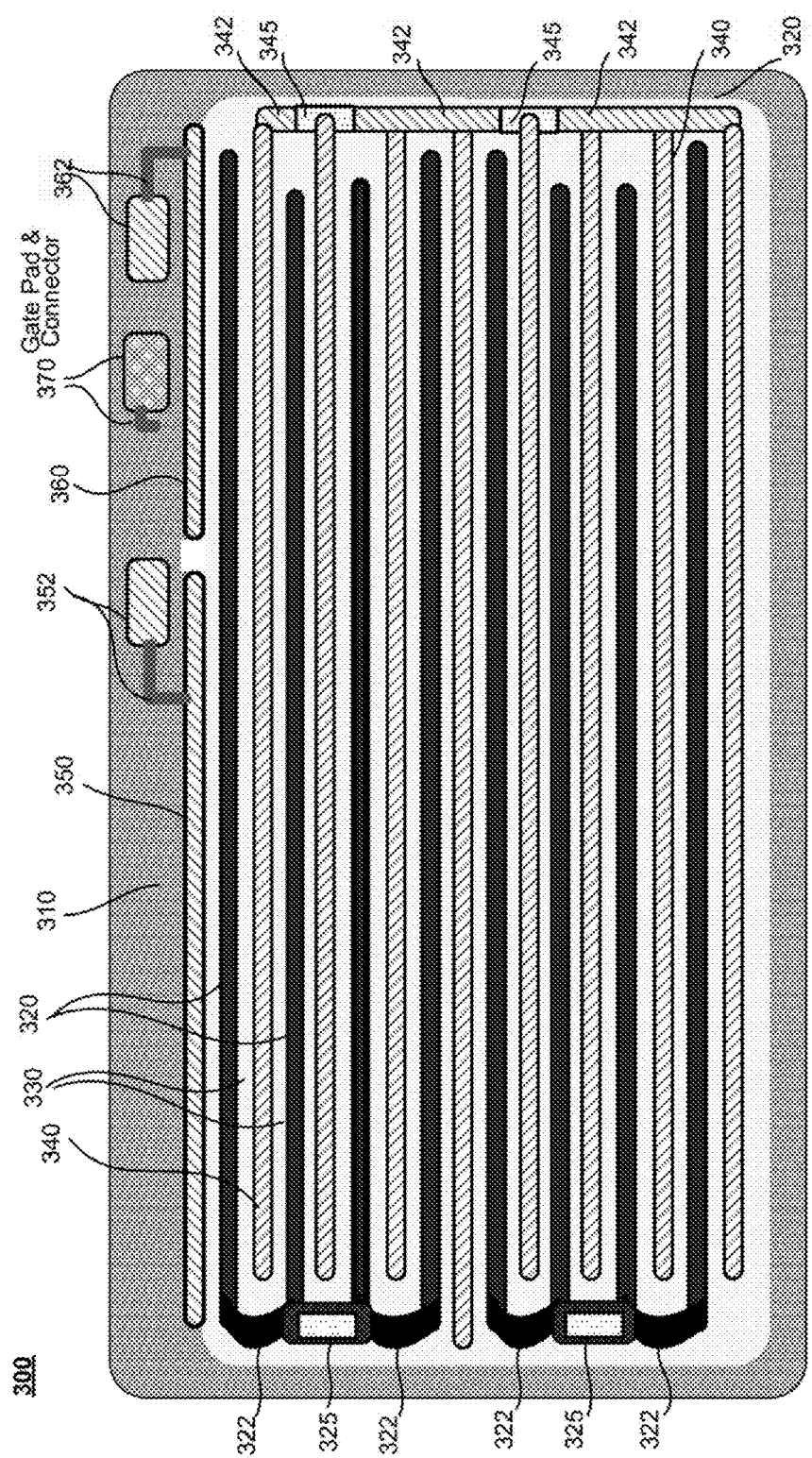
FIG. 3 is a top view layout illustration of an example power MOSFET with a multi-section sense FET finger that is partially split for use with different sense resistance values.

FIG. 3 is a top view of an example multi-cell, multi-finger transistor device that may utilize the cross sectional structure shown in FIG. 2. As can be seen, transistor device 300 comprises interdigitated source and drain regions. For example, elongated source electrode fingers 340 are shown interdigitated with elongated drain electrode fingers 320 of the high-voltage main MOS transistor. Each of the interdigitated, elongated source and drain electrode fingers is electrically connected to a respective interdigitated, elongated source and drain region disposed in the substrate. Transistor device 300 in FIG. 3 is fabricated on substrate 310. Transistor device 300 includes a high-voltage main MOSFET composed of eight drain electrode fingers 320, wherein two groups of four drain electrode finger pairs are connected through links 322 (on the left-hand side) and also through bond-wire pads 325. All of the drain electrode fingers 320 may be coupled to a common drain electrode (e,g., electrode 260 of FIG. 2). Similarly, the high-voltage main MOSFET of device 300 includes seven source electrode fingers 340, which are configured in an interdigitated arrangement or layout in relation to the drain electrode fingers 320. Source electrode fingers 340 are all coupled through link 342 (on the right-hand side) and through bond-wire pads 345.

In one embodiment, one of source electrode fingers (e.g. the uppermost source finger in FIG. 3) of device 300 is divided to multiple, distinctly separate sections, with each section being individually and separately coupled to a source region of an associated sense MOSFET. This configuration permits the transfer of current collected through each source electrode finger section to a sense resistor coupled in series with that source electrode finger. In the example of FIG. 2 the upper (top-most) source electrode finger is divided into two sections or partial fingers 350 and 360, first and second elongated source electrode fingers, each having a different relative length. The partial fingers 350 & 360 are shown disposed length-wise adjacent to one of the elongated drain electrode fingers. In one embodiment, longer section 350 is coupled to a connector and source pad 352 that connects to a first sense resistor (e.g. sense resistor 472 in FIG. 4). Shorter section 360 is coupled to a separate connector and source pad 362 which connects to a second sense resistor (e.g., sense resistor 473 in FIG. 4). In one embodiment, the sum of the length of section 350 plus the length of section 360 is less than or substantially equal to a length of the one of the elongated drain electrode fingers.

In the embodiment of FIG. 3 section 350, which is the longer portion of the sensing source finger, collects a larger percentage of the total drain current and therefore can be used for accurate measurement and control of smaller load currents. In contrast, shorter section 360 of the sensing source finger collects a smaller percentage or fraction of the total drain current: therefore it is more appropriate for use in sensing a high level current limit for protection purposes, with less risk of temperature rise effects.

Figure 4:
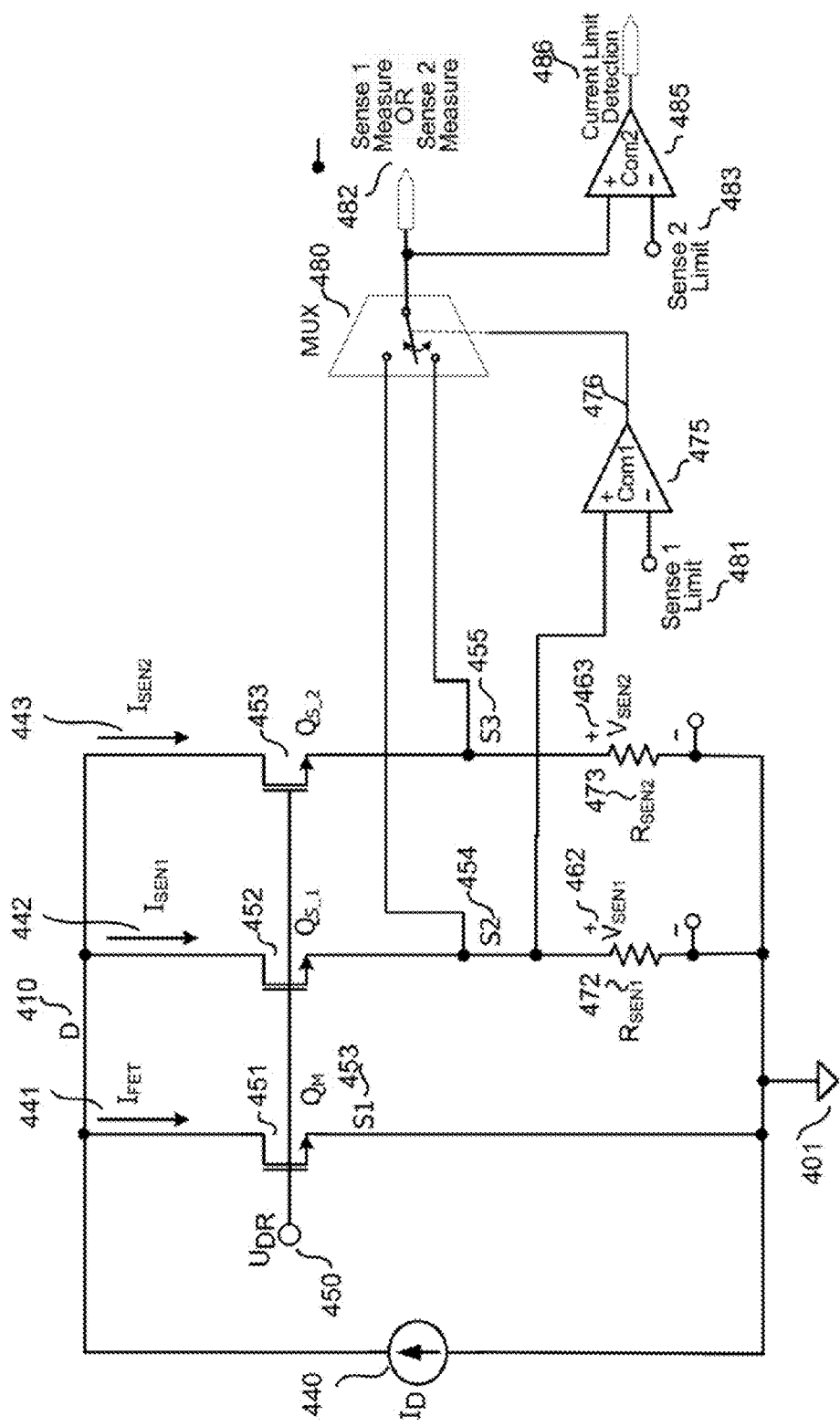
FIG. 4 shows an example circuit model for a transistor with a multi-sense FET and control couplings.

FIG. 4 shows an example circuit model for a transistor with a multi-sense FET (e.g., two sense FETs, such as shown in FIG. 3), wherein each sense resistor serves a different purpose. Current source 440 in FIG. 4 simulates the total drain current $I_D$ to the common drain node D 410. A relatively small fraction (e.g., one hundredth or less) of the total drain current is drawn by the sense transistors, such that the total drain current closely approximates the main FET current, $I_{FET}$ 441. Total drain current is divided between the main FET current ($I_{FET}$ 441), a first sense transistor current ($I_{SEN1}$ 442), and a second sense transistor current ($I_{SEN2}$ 443) Control terminals of the high-voltage main FET $Q_M$ 451 and the sense FETs $Q_{S\_1}$ 452 and $Q_{S\_2}$ 453 are coupled to receive a common control (drive) signal $U_{DR}$ 450, which, in operation, turns transistors 451, 452 and 453 ON/OFF simultaneously.

Due to the separate source nodes of sense transistors S2 454 and S3 455, each sense transistor may be coupled in series with a separate sense resistor, e.g., $R_{SEN1}$ 472 is coupled series with $Q_{S\_1}$ 452, and $R_{SEN2}$ 473 is coupled in series with $Q_{S\_2}$ 453. When sense transistors $Q_{S\_1}$ 452 and $Q_{S\_2}$ 453 are turned ON, the respective sense currents flowing through resistors $R_{SEN1}$ 472 and $R_{SEN2}$ 473 generate voltage drops $V_{SEN1}$ 462 and $V_{SEN2}$ 463, respectively. In other words, when the high-voltage main FET $Q_M$ 451 and the respective first and second sense FETs $Q_{S\_1}$ 452 and $Q_{S\_2}$ 453 are in an ON-state, first and second sense currents 442 & 443 respectively flow through first and second sense FETs $Q_{S\_1}$ 1452 and $Q_{S\_2}$ 453. In one embodiment, first current $I_{SEN1}$ 442 is larger than second current $I_{SEN2}$ 443, with the sum of currents $I_{SEN1}$ 442 & $I_{SEN2}$ 443 being a relatively small fraction of the drain current $I_{FET}$ 441 flowing through high-voltage main FET $Q_M$ 451. The measured voltage drop together with the predetermined known size of each sense transistor (452 & 453) is utilized to define the current ratio between each sensed current and the total drain current (e.g.; $I_{SEN1}/I_D$ and $I_{SEN2}/I_D$).

In one example, $R_{SEN1}$ 472 has a resistance value that is several times smaller than $R_{SEN2}$ 473 to provide higher resolution for measurements of low current. The fractions of drain current $I_{SEN1}$ 442 and $I_{SEN2}$ 443 respectively flowing through sense resistors 472 and 473 produce voltages $V_{SEN1}$ 462 and $V_{SEN2}$ 463 at nodes S2 454 and S3 455 respectively coupled to the first and second inputs of multiplexer MUX 480. As long as voltage $V_{SEN1}$ 462 is below the "sense 1 limit" voltage 481 (e.g., representing the maximum allowable load), output signal 476 of the comparator 475 is logic low and MUX 480 transfers $V_{SEN1}$ 462 to the output node 482. In one implementation, $V_{SEN1}$ 462 provided at output node 482 may be utilized for load current control and regulation purposes. In the case where $V_{SEN1}$ 462 exceeds the "sense 1 limit" 481, output signal 476 of comparator 475 changes to logic high and MUX 480 switches to transfer voltage $V_{SEN2}$ 463 to the output node 482. In one implementation, $V_{SEN2}$ 463 provided at output node 482 may be utilized for over current monitoring as well as current limit protection through comparator 485, which compares the voltage at output node 482 of the multiplexer MUX 480 with a "Sense 2 Limit" threshold 483 to generate a "current limit detection" signal 486. It is appreciated that by selecting appropriate resistance values for $R_{SEN1}$ 472 and $R_{SEN2}$ 473, a single threshold source may serve dual functions or purposes: e.g., a single threshold source "sense limit" could replace and serve as "sense 1 limit" 481 (maximum allowable load) and as "sense 2 limit" (maximum current limit protection).

Persons of skill in the art will understand that the disclosed invention may be implemented with different lateral transistors such as, metal oxide semiconductor FET (MOSFET) or a junction FET (JFET) devices, fabricated in any semiconductor material such as silicon, silicon carbide, and group III compound semiconductor, for example GaN or HEMT (high electron mobility transistor).

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example currents, voltages, resistances, device sizes, etc., are provided for explanation purposes and that other values may also be employed in other embodiments and examples in accordance with the teachings of the present invention.

We claim:

1. A lateral semiconductor field-effect transistor (FET) device fabricated on a substrate comprising:
   a high-voltage main FET having interdigitated, elongated source and drain electrode fingers each of which is electrically connected to a respective interdigitated, elongated source and drain region disposed in the substrate;
   first and second sense FETs each having a drain region in common with the high-voltage main FET, and respective first and second elongated source electrode fingers each of which is electrically connected to respective first and second elongated source regions of the first and second sense FETs, respectively, the first and second elongated source electrode fingers being disposed length-wise adjacent to one of the elongated drain electrode fingers, the first elongated source finger having a first length, and the second elongated source finger having a second length, the second length being less than the first length;
   wherein when the high-voltage main FET and the first and second sense FETs are in an on-state, first and second sense currents respectively flow through the first and second sense FETs, the first current being larger than the second current, with the sum of the first and second currents being a relatively small fraction of a drain current flowing through the high-voltage main FET.

2. The semiconductor FET device of claim 1 wherein a sum of the first length and the second length is less than or substantially equal to a length of the one of the elongated drain electrode fingers.

3. The semiconductor FET device of claim 1 further comprising a first sense resistor coupled in series with the first sense FET, and a second sense resistor coupled in series with the second sense FET, a first sense voltage being produced across the first sense resistor, and a second sense voltage being produced across the second sense resistor responsive to the first and second sense currents, respectively.

4. The semiconductor FET device of claim 3 wherein the first sense voltage and the second sense voltage are utilized for different functional limit purposes of the semiconductor FET device.

5. The semiconductor FET device of claim 1 further comprising a gate common to the high-voltage main FET and the first and second sense FETs.

6. The semiconductor FET device of claim 1 wherein the substrate is a first conductivity type, and the interdigitated, elongated source and drain regions are a second conductivity type, opposite to the first conductivity type.

7. The semiconductor FET device of claim 6 wherein the first conductivity type is P-type and the second conductivity type is N-type.

8. The semiconductor FET device of claim 6 further comprising a well region of the second conductivity type, the elongated drain regions being disposed in the well region.

9. The semiconductor FET device of claim 8 further comprising a plurality of buried regions of the first conductivity type disposed in the well region to define a plurality of lateral conduction channels.

10. The semiconductor field-effect transistor (FET) device of claim 8 wherein each of the elongated source regions is laterally separated from the well region by a portion of the substrate.

11. An integrated circuit in a substrate comprising:
a high-voltage main field-effect transistor (FET) having interdigitated, elongated source and drain electrode fingers each of which is electrically connected to a respective interdigitated, elongated source and drain region disposed in the substrate, and a gate disposed over a region of the substrate that separates the source and drain regions;
first and second sense FETs each sharing a drain region of the high-voltage main FET, the first sense FET having a first elongated source electrode finger electrically connected to a first elongated source region of the first sense FET, the second sense FET having a second elongated source electrode finger electrically connected to a second elongated source region of the second sense FET, the first and second elongated source electrode fingers being disposed length-wise adjacent to one of the elongated drain electrode fingers, the first elongated source finger having a first length, and the second elongated source finger having a second length, the second length being less than the first length, wherein when the high-voltage main FET and the first and second sense FETs are in an on-state, first and second sense currents respectively flow through the first and second sense FETs;
first and second sense resistors coupled in series with the first and second sense FETs, respectively, a first sense voltage being produced across the first sense resistor, and a second sense voltage being produced across the second sense resistor, responsive to the first and second sense currents, respectively;
a multiplexer coupled to receive the first and second sense voltages at first and second inputs, respectively, the multiplexer also having an output and a switching control input; and
a first comparator having an output coupled to drive the switching control input of the multiplexer, and a pair of inputs coupled to compare the first sense voltage with a first limit voltage, when the first sense voltage is less than the first limit voltage the first sense voltage is provided at the output of the multiplexer, and when the first sense voltage exceeds the first limit voltage, the second sense voltage is provided at the output of the multiplexer.

12. The integrated circuit of claim 1 wherein the first limit voltage is representative of a load limit through the high-voltage main FET.

13. The integrated circuit of claim 11 further comprising a second comparator having an output and a pair of inputs coupled to compare the output of the multiplexer with a second limit voltage, when the first sense voltage or second sense voltage provided at the output of the multiplexer is less than the second limit voltage, the first sense voltage or second sense voltage is provided at the output of the second comparator, and when the first sense voltage or second sense voltage provided at the output of the multiplexer exceeds the second limit voltage, the second limit voltage is provided at the output of the second comparator.

14. The integrated circuit of claim 13 wherein the second limit voltage is representative of a current limit of the high-voltage main FET.

15. The integrated circuit of claim 13 wherein a size of the first sense FET is proportional to the first length, and a size of the second sense FET is proportional to the second length, such that the first sense current is a first fraction, and the second sense current is a second fraction, of a drain current flowing through the high-voltage main FET when the high-voltage main FET and the first and second sense FETs are in an on-state.

16. The integrated circuit of claim 11 wherein a sum of the first length and the second length is less than or substantially equal to a length of the one of the elongated drain electrode fingers.

17. The integrated circuit of claim 11 wherein the first sense voltage and the second sense voltage are utilized for different functional limit purposes of the high-voltage main FET.

18. The integrated circuit of claim 17 wherein the first sense FET and first resistor are configured such that the first sense voltage provides maximum load current detection.

19. The integrated circuit of claim 17 wherein the second sense FET and second resistor are configured such that the second sense voltage provides current short circuit fault protection.

* * * * *